(12) United States Patent
Ohmori et al.

(10) Patent No.: US 7,030,165 B2
(45) Date of Patent: Apr. 18, 2006

(54) PEROVSKITE TITANIUM-TYPE COMPOSITE OXIDE PARTICLE AND PRODUCTION PROCESS THEREOF

(75) Inventors: Masahiro Ohmori, Chiba (JP); Akihiko Kotera, Chiba (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/815,832

(22) Filed: Apr. 2, 2004

(65) Prior Publication Data

US 2004/0185246 A1    Sep. 23, 2004

Related U.S. Application Data

(62) Division of application No. 09/579,708, filed on May 26, 2000, now Pat. No. 6,893,623.

(60) Provisional application No. 60/136,217, filed on May 26, 1999.

(51) Int. Cl.
*C01G 23/00* (2006.01)
*C01G 21/00* (2006.01)
*C01F 11/00* (2006.01)
*C01F 5/00* (2006.01)

(52) U.S. Cl. .......................................... 516/33; 516/90
(58) Field of Classification Search ................ 516/33, 516/90
See application file for complete search history.

(56) References Cited

U.S. PATENT DOCUMENTS

| | | | |
|---|---|---|---|
| 2,841,503 A * | 7/1958 | Graham et al. ............ | 427/372.2 |
| 3,292,994 A | 12/1966 | Kiss et al. | |
| 3,577,487 A | 5/1971 | Sanchez et al. | |
| 3,647,364 A | 3/1972 | Mazdiyasni et al. | |
| 4,764,493 A | 8/1988 | Lilley et al. | |
| 4,816,072 A | 3/1989 | Harley et al. | |
| 4,832,939 A | 5/1989 | Menashi et al. | |
| 4,898,843 A | 2/1990 | Matsushita et al. | |
| 4,937,213 A | 6/1990 | Berneir et al. | |
| 5,204,031 A | 4/1993 | Watanabe et al. | |
| 5,219,811 A | 6/1993 | Enomoto et al. | |
| 5,242,674 A | 9/1993 | Bruno et al. | |
| 5,900,223 A | 5/1999 | Matijevic et al. | |
| 6,017,504 A | 1/2000 | Kaliaguine et al. | |
| 6,129,903 A | 10/2000 | Kerchner | |

FOREIGN PATENT DOCUMENTS

| | | |
|---|---|---|
| JP | 5-178617 | 7/1993 |
| JP | 6-305729 | 1/1994 |
| JP | 6-316414 | 11/1994 |
| JP | 7-69635 | 3/1995 |
| JP | 7-277710 | 10/1995 |
| JP | 7-291607 | 11/1995 |
| JP | 8-119745 | 5/1996 |
| JP | 8-296077 | 11/1996 |
| JP | 11-228139 | 8/1999 |
| JP | 2000-160360 | 6/2000 |

OTHER PUBLICATIONS

Search Report for WO00/35811 dated Mar. 7, 2000.

* cited by examiner

*Primary Examiner*—Steven Bos
(74) *Attorney, Agent, or Firm*—Sughrue Mion, PLLC

(57) ABSTRACT

A perovskite titanium-containing composite oxide particle have a composition represented by general formula (I), where the specific surface area is about 10 to about 200 $m^2/g$, the specific surface area diameter $D_1$ of the primary particles defined by formula (II) is about 10 to about 100 nm, and a $D_2/D_1$ ratio of the average particle size $D_2$ of secondary particles to $D_1$ is about 1 to about 10:

$$M(TiO_3) \qquad (I)$$

wherein M is at least one of Ca, Sr, Ba, Pb, or Mg $$D_1 = 6/\rho S \qquad (II)$$

wherein $\rho$ is the density of the particles, and S is the specific surface area of the particles is disclosed. The present invention has a small particle size and excellent dispersion properties, so that the particle is suitable for application to functional materials.

7 Claims, 2 Drawing Sheets

20nm

20nm

PEROVSKITE TITANIUM-TYPE COMPOSITE OXIDE PARTICLE AND PRODUCTION PROCESS THEREOF

This is a divisional of application Ser. No. 09/579,708 filed May 26, 2000 now U.S. Pat. No. 6,893,623 for patent filed under 35 U.S.C. § 111(a) which is entitled under 35 U.S.C. § 119(e)(1) to the benefit of the filing date of provisional application Ser. No. 60/136,217 filed May 26, 1999 under 35 U.S.C. § 111(b), the disclosures of which are incorporated herein by reference.

FIELD OF THE INVENTION

The present invention relates to a titanium-containing composite oxide particle, a sol of the above-mentioned composite oxide particle, a production process thereof, and a thin film made therefrom. More specifically, the present invention is to provide a perovskite titanium-containing composite oxide particle and a sol thereof, with a small particle size and excellent dispersion properties.

BACKGROUND OF THE INVENTION

A perovskite titanium-containing composite oxide represented by barium titanate is widely used for functional materials such as a dielectric material, a laminated ceramic capacitor, a piezoelectric material, and a memory. In recent years, in line with the trend toward small-size, light-weight electronic devices, it has been desired to develop a method for obtaining a perovskite titanium-containing composite oxide particle with a smaller particle size and more noticeable dispersion properties at low cost. Further, such a titanium-containing composite oxide particle that has the above-mentioned characteristics is expected to be applied to a photocatalyst.

The perovskite titanium-containing composite oxide is obtained by a solidus method of mixing finely-divided particles of the raw materials such as an oxide and a carbonate in a ball mill, and carrying out the reaction at a high temperature of over about 800° C.; by an oxalate method of first preparing a composite salt of oxalic acid, followed by thermal decomposition; by an alkoxide method of subjecting a raw material such as a metal alkoxide to hydrolysis to obtain a precursor; or by a hydrothermal synthesis method of allowing the raw materials to react at high temperature under high pressure to obtain a precursor. In addition to the above, the perovskite titanium-containing composite oxide can be also obtained by a method of preparing titanium oxide or the precursor thereof, dispersing the titanium oxide or precursor thereof in a solvent, and making a composite of titanium oxide or precursor thereof in the solution by the addition of a predetermined element (Japanese Laid-Open Patent Application 8-119633), and a method of employing titanium tetrachloride or titanium sulfate as the raw material (Japanese Laid-Open Patent Application 59-39726).

However, the solidus method produces particles with a large particle size, lacking uniformity, which are not suitable for the functional materials such as the dielectric material and piezoelectric material although the low manufacturing cost is industrially advantageous. The particle size obtained by the oxalate method is 0.2 to 0.5 μm, which is smaller than that by the solidus method, but not sufficiently small. The alkoxide method can produce particles with a particle size of 20 nm to 30 nm, but the manufacturing cost is high because organic materials are used as the raw materials. In addition, the hydrothermal synthesis method has a problem in that the cost becomes high because special facilities are required to carry out the synthesis under conditions of high temperature and high pressure.

Unless the dispersion properties of the particles are sufficient, the particles will aggregate in a solvent even if they can be prepared with a small particle size by any of the above-mentioned methods. The result is that when the particles are molded and sintered to prepare a product of the functional material such as a dielectric material or piezoelectric material, the particles cannot exhibit satisfactory characteristics. Furthermore, of the perovskite titanium-containing composite oxide particles, $SrTiO_3$ is particularly expected because of its photocatalytic activation performance. However, to obtain small particles is not easy. Namely, it is hard to inexpensively obtain particles with excellent photocatalytic activation performance.

The object of the present invention is to provide a perovskite titanium-containing composite oxide particle with a small particle size and excellent dispersion properties, and a sol thereof at low cost.

SUMMARY OF THE INVENTION

The present invention is directed to a perovskite titanium-containing composite oxide particle having a composition represented by general formula (I), wherein the specific surface area is about 10 to about 200 $m^2/g$, the specific surface area diameter $D_1$ of the primary particles-as defined by formula (II) is about 10 to about 100 nm, and the ratio $D_2/D_1$ of an average particle size $D_2$ of the secondary particles to $D_1$ is about 1 to about 10:

$$M(TiO_3) \quad (I)$$

(wherein M is at least one of Ca, Sr, Ba, Pb, or Mg)

$$D_1 = 6/\rho S \quad (II)$$

(wherein ρ is the density of the particles, and S is the specific surface area of the particles.)

The perovskite titanium-containing composite oxide particle of the present invention is most suitable for functional materials such as a dielectric material and a piezoelectric material, a memory, and a photocatalyst because the particle size is very small and the dispersion properties thereof are excellent.

DESCRIPTION OF THE PREFERRED EMBODIMENTS

Figure 1:
FIG. 1 is a photomicrograph taken by a transmission electron microscope, which shows titanium oxide particles in a titanium oxide sol obtained in Example 1.

The present invention will now be explained in detail.

The perovskite titanium-containing composite oxide particle of the present invention has a composition represented by general formula (I), with the specific surface area being about 10 to about 200 $m^2/g$, the specific surface area diameter $D_1$ of the primary particles being about 0.10 to about 100 nm, and the ratio $D_2/D_1$ of an average particle size $D_2$ of the secondary particle to $D_1$ being about 1 to about 10.

The specific surface area diameter $D_1$ of the primary particles is obtained in accordance with formula (II), wherein ρ is the density of the particles, and S is the specific surface area of the particles measured by the BET method. The average particle size $D_2$ of the secondary particles is a value measured with a particle size distribution analyzer after dispersing titanium-containing composite oxide particles in a solvent. The particle size distribution is usually measured by centrifugal sedimentation, electrozone (by use of the Coulter Counter®), or a light scattering measurement method. The light scattering measurement method is preferable because the sensitivity is high. The smaller the calculated value of $D_2/D_1$, the better the dispersion properties of the particles. Theoretically, the value of $D_2/D_1$ cannot be less than 1 when the particles are spherical. On the other hand, a value of more than about 10 is not preferable because the primary particles show poor dispersion properties and tend to aggregate.

In the perovskite titanium-containing composite oxide particles of the present invention, the value of $D_2/D_1$ is about 1 to about 10, which means excellent dispersion properties of the primary particles. Further, since these particles can show sufficient transparency when formed into a thin film, the particles can be applied to a memory and a photocatalyst. In particular, $SrTiO_3$ of general formula (I) wherein M represents Sr is suitable for the photocatalyst.

The above-mentioned perovskite titanium-containing composite oxide is available not only in the form of particles, but also in the form of a sol in which these particles are dispersed.

$$M(TiO_3) \quad (I)$$

(wherein M is at least one of Ca, Sr, Ba, Pb, or Mg.)

$$D_1 = 6/\rho S \quad (II)$$

Next, the production process according to the present invention will be explained.

With respect to the titanium oxide particle with a brookite crystalline form for use in the present invention, titanium oxide with a brookite crystalline form may be used alone, or be used in combination with a rutile titanium oxide and an anatase titanium oxide so long as a brookite crystalline form is contained. When the rutile titanium oxide and the anatase titanium oxide are contained, the ratio of the brookite titanium oxide in the entire titanium oxide is not particularly limited, but preferably in the range of about 1 to about 100 wt. %, more preferably about 10 to about 100 wt. %, and further preferably about 50 to about 100 wt. %. This is because crystalline titanium oxide particles can be dispersed in the form of separate single particles in a liquid phase more easily and can exhibit more significant dispersion properties than amorphous titanium oxide particles. In particular, the brookite titanium oxide is preferred to the titanium oxide of a rutile crystalline form and anatase crystalline form in terms of dispersion properties. The reason why the dispersion properties of the brookite titanium oxide are superior is not clear, but is believed to be related to the fact that the ζ-potential (electrokinetic potential) of the brookite crystal is higher than that of the rutile crystal or anatase crystal.

There are methods of obtaining titanium oxide particles comprising a brookite crystalline form, for example, a method of subjecting anatase titanium oxide particles to thermal treatment in a vapor phase, and a manufacturing method in a liquid phase whereby a titanium oxide sol of dispersed titanium oxide particles is prepared by neutralizing a solution of titanium tetrachloride, titanium trichloride, titanium alkoxide, or titanium sulfate or subjecting the above-mentioned solution to hydrolysis.

Of the above-mentioned production processes, the process is not particularly limited as long as titanium oxide particles comprising the brookite crystalline form can be obtained. However, the method of obtaining a titanium oxide sol by subjecting a titanium salt to hydrolysis in an acid solution, which was previously invented by the inventors of the present invention, is preferable. This is because when the titanium oxide particles obtained by the above-mentioned method are made into a titanium-containing composite oxide, a perovskite titanium oxide particle with a small particle size and excellent dispersion properties can be obtained. More specifically, preferable methods include adding titanium tetrachloride to hot water at 75 to 100° C. to carry out hydrolysis of the titanium tetrachloride at a temperature which is more than or equal to 75° C., and less than or equal to the boiling point of the solution, with the concentration of the chlorine ions being controlled, thereby obtaining titanium oxide particles with a brookite crystalline structure in the form of a titanium oxide sol (Japanese Patent Application 9-23 1172), and adding titanium tetrachloride to hot water at 75 to 100° C. to carry out hydrolysis of the titanium tetrachloride in the presence of nitrate ions and/or sulfate ions at a temperature which is more than or equal to 75° C., and less than or equal to the boiling point of the solution, with the total concentration of chlorine ions, nitrate ions, and sulfate ions being controlled, thereby obtaining titanium oxide particles with a brookite crystalline structure in the form of a titanium oxide sol (Japanese Patent Application 10-132195).

The particle size of the thus obtained titanium oxide particles with a brookite crystalline form is usually in the range of about 5 to about 50 nm when determined from the specific surface area of the primary particles. When the specific surface area diameter of the primary particles exceeds about 50 nm, the particle size of the titanium-containing composite oxide particles made from the above-mentioned raw material particles becomes so large that those composite oxide particles are not suitable for functional materials such as a dielectric material and a piezoelectric material, a memory, and a photocatalyst. When the particle size is less than about 5 nm, handling of the titanium oxide particles becomes difficult in the process of manufacturing thereof.

To produce a sol in which the perovskite titanium-containing composite oxide particles of the present invention are dispersed, a titanium oxide sol obtained by subjecting a titanium salt to hydrolysis in an acid solution may be used instead of the titanium oxide particles with a brookite crystalline form. There is no limitation to the crystalline form of titanium oxide particles in the titanium oxide sol as long as the titanium oxide sol is obtained by carrying out the hydrolysis of the titanium salt in an acid solution.

When the titanium salt such as titanium tetrachloride or titanium sulfate is subjected to hydrolysis in an acid solution, the reaction rate is reduced as compared with the case where the hydrolysis is carried out in a neutral or alkaline solution. Therefore, the particles can be formed in separate single particles, thereby obtaining a titanium oxide sol with excellent dispersion properties. Further, since anionic ions such as chlorine ions and sulfate ions are not readily trapped in the inside of the generated titanium oxide particles, it is possible to restrain the inclusion of anionic ions in the particles in the course of production of the titanium-containing composite oxide particles. In addition, when a titanium salt is subjected to hydrolysis in a neutral or alkaline solution, the reaction rate is increased to cause considerable nucleation in the initial stage. The result is that the obtained titanium oxide sol shows poor dispersion properties although the particle size is small, and consequently the particles tend to form a cloud-like aggregate. When such a titanium oxide sol is made into a sol of titanium-containing composite oxide particles, the dispersion properties become poor although the particle size of the particles in the sol is small. In addition, the anionic ions are easily trapped in the inside of the titanium oxide particles in the sol. The removal of these anionic ions will thus become difficult in the subsequent processes.

The method o obtaining a titanium oxide sol by subjecting a titanium salt to hydrolysis in an acid solution is not particularly limited as long as the solution can be maintained acid. The method of subjecting titanium tetrachloride serving as a raw material to hydrolysis in a reaction vessel equipped with a reflux condenser, the solution being maintained acid by inhibiting the chlorine atom generated in the course of hydrolysis from escaping, which method was previously invented by the inventors of the present invention (Japanese Patent Application 8-230776) is preferable.

It is preferable that the acid solution of a titanium salt serving as the raw material have a concentration of about 0.01 to about 5 mol/L. When the concentration exceeds about 5 mol/L, the reaction rate of the hydrolysis is accelerated, and a titanium oxide sol with a large particle size and poor dispersion properties is obtained. When the concentration is less than about 0.01 mol/L, the density of the titanium oxide particles in the obtained sol is decreased, which lowers the productivity.

A metal salt for use in the present invention which comprises at least one of Ca, Sr, Ba, Pb, or Mg is not particularly limited as long as any of the above-mentioned metals are contained. It is preferable that such a metal salt be water-soluble. Usually, a nitrate, an acetate, or a chloride salt is usable. These metal salts may be used alone, or two or more metal salts may be mixed in an arbitrary ratio. More specifically, when the metal salt contains Ba, barium chloride, barium nitrate, and barium acetate are usable; and when the metal salt contains Sr, strontium chloride, strontium nitrate, and strontium acetate are usable.

The method for producing a sol in which the perovskite titanium-containing composite oxide particles are dispersed according to the present invention comprises the step of allowing the titanium oxide particles with a brookite crystalline form, or the titanium oxide sol obtained by subjecting a titanium salt to hydrolysis in an acid solution to react with a metal salt comprising at least one of Ca, Sr, Ba, Pb, or Mg in a liquid phase. Although the reaction conditions are not particularly limited, in general, it is preferable to carry out the reaction in an alkaline solution by employing an alkaline liquid phase. It is preferable that the pH of the solution be about 13.0 or more, and more preferably 14.0 or more. When the pH is set to 14.0 or more, the particle size of the titanium-containing composite oxide particles dispersed in the sol can be decreased.

To make the liquid phase alkaline, an alkaline compound is added to the liquid phase. When hydroxides of alkali metals, such as lithium hydroxide, sodium hydroxide, and potassium hydroxide are used as the alkaline compounds, the alkali metals may remain in the titanium-containing composite oxide particles, and there is a risk that when the titanium-containing composite oxide particles are molded and sintered to produce functional materials such as a dielectric material and a piezoelectric material, the characteristics of the obtained functional materials will deteriorate.

In light of the above, it is preferable to use an organic alkaline compound such as tetramethylammonium hydroxide as the alkaline compound.

It is preferable that the reaction solution be controlled to have the titanium oxide particle concentration in the range of about 0.1 to about 5 mol/L, and the concentration of the metal salt having a metal represented by M in the range of about 0.1 to about 5 mol/L when calculated in terms of the concentration of the metallic oxide.

The thus prepared alkaline solution is usually heated to about 40 to about 120° C., preferably about 80 to about 0.120° C., with stirring at atmospheric pressure to carry out the reaction. The reaction time is usually about one hour or more, preferably about 4 hours or more. Thereafter, impure ions are removed from the slurry obtained after completion of the reaction by various methods such as electrodialysis, ion exchange, water washing, and osmosis using a membrane, whereby the pH is controlled to about 10 or less. Then, with the addition of water and a water-soluble organic solvent to the solution, the solid concentration in the solution is controlled to a predetermined concentration. At that time, a dispersant and a film-forming assistant may be added to the solution. Polyphosphoric acid, hexametaphosphoric acid, and dodecylbenzenesulfonic acid can be employed as the dispersant; and alcohols such as butyl alcohol, and water-soluble polymeric materials such as poly(vinyl alcohol) and methyl cellulose can be employed as the film-forming assistant.

The perovskite titanium-containing composite oxide particles can be obtained by removing the dispersion medium from the sol obtained in the above-mentioned manner. The dispersion medium is commonly removed from the sol by filtration, centrifugal separation, or drying. In this case, the solid may be washed with water when necessary. Further, the obtained perovskite titanium-containing composite oxide particles may be calcined.

The drying operation is usually carried out at a temperature ranging from room temperature to about 150° C. for about one to about 24 hours. The drying atmosphere is not particularly limited, but the drying operation is carried out in air or under reduced pressure. Calcining is generally performed at about 300 to about 1000° C. in order to improve the crystallizability of the titanium-containing composite oxide, and, at the same time, to remove the remaining impurities, for example, anionic ions such as chlorine ions, sulfate ions, and phosphate ions, and alkaline compounds such as tetramethylammonium hydroxide. The calcining atmosphere is not particularly limited, and the calcining is generally carried out in air.

The application of the sol of perovskite titanium-containing composite oxide particles according to the present invention is not particularly limited. Since the titanium-containing composite oxide particles dispersed in this sol show a small particle size and excellent dispersion properties, the sol is favorably used for the formation of a thin film of a titanium-containing composite oxide. For the formation of a thin film using the sol, the solid content in the sol is first adjusted by the addition of water and a water-soluble organic solvent, if necessary, to the sol in which the perovskite titanium-containing composite oxide particles are dispersed. The sol for which the solid content has been thus adjusted is then coated on a base such as ceramic, metal, glass, plastic, paper, or wood. The sol on the base is dried to eliminate the dispersion medium from the sol, and is subjected to sintering when necessary, thereby forming a thin film of the titanium-containing composite oxide. Thus, a thin-film laminated product in which a thin film is overlaid on the base can be obtained. The transparency of the thin film thus obtained is particularly so excellent that the thin film is most applicable to the functional materials such as dielectric materials and piezoelectric materials, memory, and photocatalyst. In particular, the thin film of $SrTiO_3$ is suitable for the photocatalyst.

BEST MODE FOR CARRYING OUT THE INVENTION

The present invention will now be explained more specifically with reference to examples.

EXAMPLE 1

An aqueous solution of titanium tetrachloride (with a purity of 99.9%) at a concentration of 0.25 mol/L was placed in a reaction vessel equipped with a reflux condenser and heated to a temperature close to the boiling point, with the acid solution being maintained by restraining chlorine ions from escaping. The titanium tetrachloride was subjected to hydrolysis with maintained at the above-mentioned temperature for 60 minutes, thereby obtaining a titanium oxide sol. A photomicrograph of the obtained titanium oxide sol, taken by a transmission electron microscope, is shown in FIG. 1. FIG. 1 indicates a monodisperse sol containing particles with a particle size of about 15 nm. This sol was thickened by sedimentation. In 320 g of a sol thus thickened to have a concentration of titanium oxide of 10 wt. %, 97.7 g of barium chloride.2hydrate (made by Kokusan Chemical Works, Ltd.) was dissolved. With the addition of 600 g of an aqueous solution containing 20 wt. % of tetramethylammonium hydroxide, the resultant mixture was adjusted to pH 14, followed by stirring for one hour. Thereafter, the slurry was heated at 110° C. to carry out the reaction for 4 hours with the temperature being maintained. The sol thus obtained was washed with water, filtered, and dried at 150° C. for 12 hours, thereby obtaining finely-divided particles.

The above prepared particles were examined by X-ray diffraction using an X-ray diffraction measuring instrument ("D-MAX-RB", made by Rigaku Corporation) to determine that the obtained particles were $BaTiO_3$ of a perovskite cubic system. The specific surface area S obtained by the BET method was 34 $m^2/g$, and the specific surface area diameter $D_1$, which was calculated in accordance with formula (II), was 0.03 μm. The average particle size $D_2$ was 0.21 μm when measured using a light scattering particle size distribution analyzer ("ELS-8000", made by OTSUKA ELECTRONICS Co., Ltd.) under such conditions that these particles were dispersed in water. The $D_2/D_1$ ratio was 7.0.

EXAMPLE 2

A monodisperse titanium oxide sol comprising particles with a particle size of about 8 nm was prepared by the same method as in Example 1. Using the above-mentioned sol, finely-divided particles of $BaTiO_3$ with a perovskite cubic system were obtained in the same manner as in Example 1. When the finely-divided particles thus obtained were examined in the same manner as in Example 1, the specific surface area S was 46 $m^2/g$, the specific surface area diameter $D_1$ was 0.02 μm, the average particle size $D_2$ was 0.19 μm, and the $D_2/D_1$ ratio was 9.5.

EXAMPLE 3

A monodisperse titanium oxide sol comprising particles with a particle size of about 10 nm was prepared by the same method as in Example 1 except that the titanium tetrachloride was replaced by titanium sulfate, and therefore sulfate ions, not chlorine ions, were restrained from escaping. Using the above-mentioned sol, finely-divided particles of $BaTiO_3$ with a perovskite cubic system were obtained in the same manner as in Example 1. When the finely-divided particles thus obtained were examined in the same manner as in Example 1, the specific surface area S was 40 $m^2/g$, the specific surface area diameter $D_1$ was 0.03 μm, the average particle size $D_2$ was 0.22 μm, and the $D_2/D_1$ ratio was 7.3.

EXAMPLE 4

A monodisperse titanium oxide sol comprising particles with a particle size of about 15 nm was prepared by the same method as in Example 1. Using the above-mentioned sol, finely-divided particles of $SrTiO_3$ with a perovskite cubic system were obtained in the same manner as in Example 1 except that 106.7 g of strontium chloride.6 hydrate was used instead of the barium chloride. When the finely-divided particles thus obtained were examined in the same manner as in Example 1, the specific surface area S was 28 $m^2/g$, the specific surface area diameter $D_1$ was 0.05 μm, the average particle size $D_2$ was 0.10 μm, and the $D_2/D_1$ ratio was 2.

EXAMPLE 5

A monodisperse titanium oxide sol comprising particles with a particle size of about 15 nm was prepared by the same method as in Example 1. Using the above-mentioned sol, a strontium titanate sol with pH 14 was obtained through the same reaction as mentioned in Example 1 except that 106.7 g of strontium chloride.6 hydrate was used instead of the barium chloride. The concentration of strontium titanate in the sol was 7 wt. %.

The thus obtained sol was cooled, and adjusted to pH 8 in such a manner that the remaining ammonium salt and chlorine were removed from the sol by electrodialysis. In the electrodialysis, a commercially available membrane "Selemion ME-0", made by Asahi Glass Co., Ltd. was adapted.

Part of the above prepared sol was dried in a vacuum dryer so that finely-divided particles of $SrTiO_3$ with a perovskite cubic system were obtained. When the finely-divided particles thus obtained were examined in the same manner as in Example 1, the specific surface area S was 29 $m^2/g$, the specific surface area diameter $D_1$ was 0.05 μm, the average particle size $D_2$ was 0.08 μm, and the $D_2/D_1$ ratio was 1.6.

Ethyl alcohol was added to the rest of the strontium titanate sol containing 7 wt. % of strontium titanate to a strontium titanate concentration of 5 wt. %. Thereafter, poly(vinyl alcohol) serving as a film-forming assistant was added to the sol in an amount of 500 ppm of the total weight of the sol.

The thus obtained sol for film formation was coated on a glass plate by dip coating and dried, and further calcined at 500° C. in air for one hour, thereby forming a thin film of strontium titanate on the glass base. Thus, a thin-film laminated product was obtained. The thickness of the thin film on the glass base was 0.3 μm. When this thin film was observed under a scanning electron microscope (SEM), the particle size of the strontium titanate in the thin film was found to be 0.043 μm.

Furthermore, the transparency and the photocatalytic power of the resulting thin-film laminated product were evaluated by the following methods. The results are shown in TABLE 1. The transparency was measured in accordance with the Japanese Industrial Standard JIS K6718 using a commercially available hazemeter made by Tokyo Denshoku Gijutsu Center, and evaluated on three levels. With respect to the photocatalytic power, several drops of red ink were applied to the strontium titanate thin film of the thin-film laminated product, and the red-ink applied portion was exposed to ultraviolet light for 30 minutes, using black light with an ultraviolet intensity of 2.1 mW/cm$^2$ at a wavelength of 365 nm. The degree of color fading was visually inspected, and evaluated on three levels.

TABLE 1

|  | Transparency | Photocatalytic Power |
| --- | --- | --- |
| Example 5 | ◎ | ◎ |
| Comparative Example 4 | X | X |

Symbols in TABLE 1 denote the following:
Transparency
　◎—haze of less than 2.0%.
　○—haze of 2.0% or more, and less than 5.0%.
　×—haze of 5.0% or more.
Photocatalytic Power
　◎—sufficient color fading.
　○—locally no color fading.
　×—no color fading.

COMPARATIVE EXAMPLE 1

Figure 2:
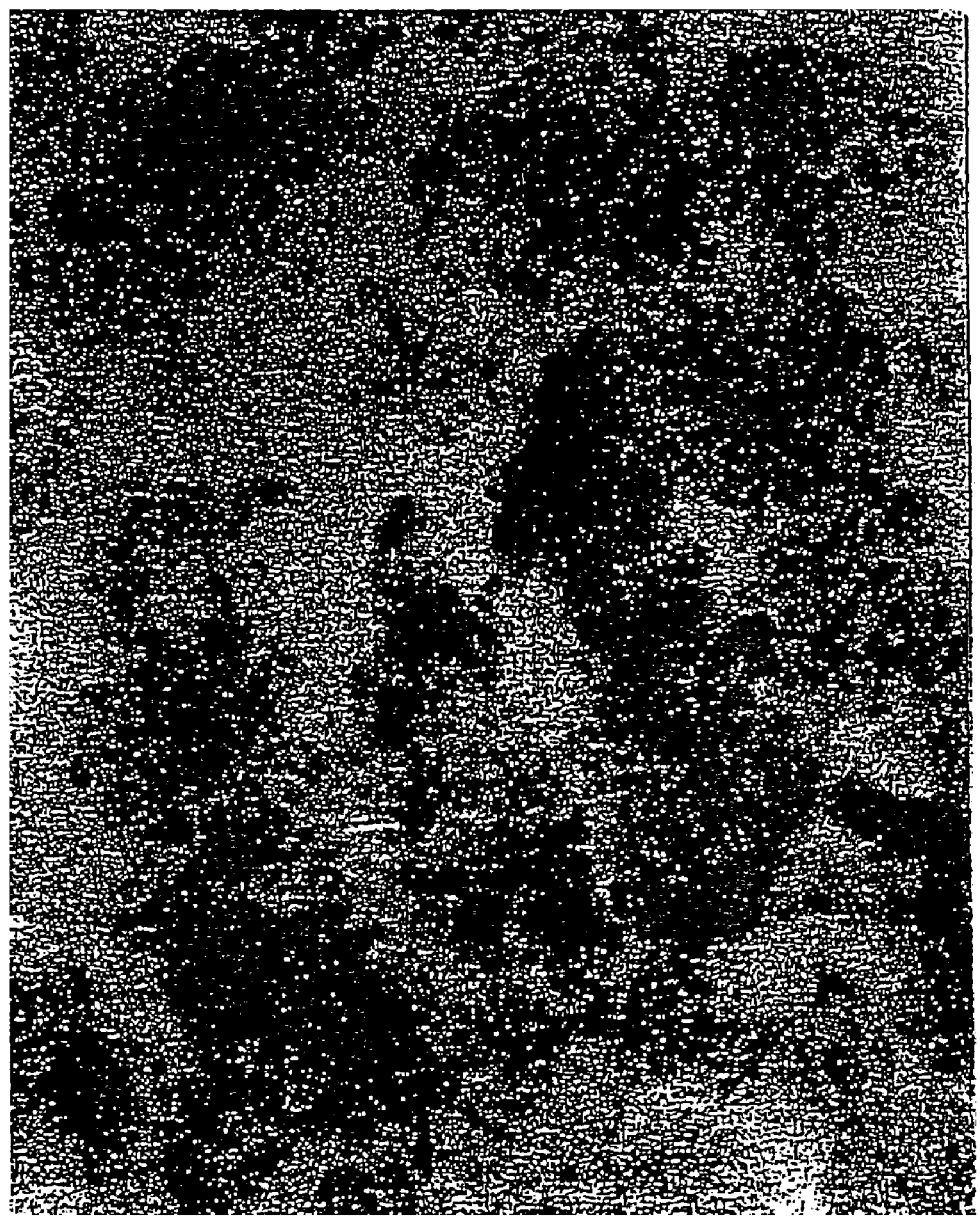
FIG. 2 is a photomicrograph taken by a transmission electron microscope, which shows titanium oxide particles in a titanium oxide sol obtained in Comparative Example 1.

A titanium oxide sol was prepared by the same method as in Example 1 except that the aqueous solution of titanium tetrachloride (with a purity of 99.9%) at a concentration of 2.5 mol/L was adjusted to pH 7 by the addition of ammonium hydroxide, and the resultant mixture was placed in a reaction vessel equipped with a reflux condenser. A photomicrograph of the obtained titanium oxide sol, taken by a transmission electron microscope, is shown in FIG. 2. FIG. 2 indicates that the primary particles in the sol are aggregated particles with a particle size of about 5 nm. Using the above-mentioned sol, finely-divided particles of BaTiO$_3$ with a perovskite cubic system were obtained in the same manner as in Example 1. When the finely-divided particles thus obtained were examined in the same manner as in Example 1, the specific surface area S was 58 m$^2$/g, the specific surface area diameter $D_1$ was 0.02 μm, the average particle size $D_2$ was 0.25 μm, and the $D_2/D_1$ ratio was 12.5.

COMPARATIVE EXAMPLE 2

Finely-divided particles of BaTiO$_3$ with a perovskite cubic system were obtained in the same manner as in Example 1 except that 320 g of an aqueous solution containing 10 wt. % of titanium oxide was employed, which solution was prepared by sufficiently dispersing a commercially available titanium oxide sol ("F-4", made by Showa Titanium Co., Ltd., of which the specific surface area diameter was 28 nm) by the application of ultrasonic vibration. When the finely-divided particles thus obtained were examined in the same manner as in Example 1, the specific surface area S was 28 m$^2$/g, the specific surface area diameter $D_1$ was 0.04 μm, the average particle size $D_2$ was 0.44 μm, and the $D_2/D_1$ ratio was 11.0.

COMPARATIVE EXAMPLE 3

To an aqueous solution of titanium tetrachloride (with a purity of 99.9%) at a concentration of 2.5 mol/L, barium nitrate was added in an amount equimolar with the titanium in the aqueous solution, and potassium hydroxide was further added so that the solution was adjusted to pH 13.5. The solution was heated to a temperature close to the boiling point with stirring, and thereafter maintained at the above-mentioned temperature for 4 hours to carry out the reaction. A slurry thus obtained was washed with water, filtered, and dried at 150° C. for 12 hours, whereby finely-divided particles of BaTiO$_3$ with a perovskite cubic system were obtained. When the finely-divided particles thus obtained were examined in the same manner as in Example 1, the specific surface area S was 28 m$^2$/g, the specific surface area diameter $D_1$ was 0.04 μm, the average particle size $D_2$ was 0.45 μm, and the $D_2/D_1$ ratio was 11.3.

COMPARATIVE EXAMPLE 4

Water and ethyl alcohol were added to a commercially available strontium titanate ("ST-HP-1", made by Kyoritsu Ceramic Materials Co., Ltd., of which the specific surface area was 20 m$^2$/g, $D_1$ was 0.1 μm, the average particle size $D_2$ was 1.5 μm, and the $D_1/D_2$ ratio was 15) so that the concentration of strontium titanate was adjusted to 5 wt. %, and poly(vinyl alcohol) serving as a film-forming assistant was added to the sol in an amount of 500 ppm with respect to the total weight of the sol in a similar manner to that in Example 5.

Using the thus obtained sol for film formation, a thin film of strontium titanate was formed on the glass base by the same method as in Example 5. Thus, a thin-film laminated product was obtained. The thickness of the thin film on the glass base was 3 μm. When this thin film was observed under a scanning electron microscope (SEM), the particle size of the strontium titanate in the thin film was found to be 1.5 μm.

Furthermore, the transparency and the photocatalytic power of the resulting thin-film laminated product were examined in the same manner as in Example 5. The results are shown in TABLE 1.

As previously mentioned, the perovskite titanium-containing composite oxide particle and the sol thereof according to the present invention showed a small particle size and excellent dispersion properties. It was possible to produce such a particle and a sol using an inexpensive raw material such as titanium tetrachloride or titanium sulfate. Further, when the titanium-containing composite oxide was strontium titanate, the titanium-containing composite oxide was provided with high photocatalytic power.

INDUSTRIAL APPLICABILITY

As previously explained, the perovskite titanium-containing composite oxide particle according to the present invention has a specific surface area of about 10 to about 200 m$^2$/g, a specific surface area diameter $D_1$ of the primary particles of about 10 to about 100 nm, and a $D_2/D_1$ ratio of the average particle size $D_2$ of the secondary particles to $D_1$ of about 1 to about 10. The particle size is small and the dispersion properties are excellent, so that the perovskite titanium-containing composite oxide particle is very suitable for the application to functional materials such as a dielectric material and a piezoelectric material, a memory, and a photocatalyst.

The invention claimed is:

1. A sol comprising dispersed perovskite titanium-containing composite oxide particle having a composition represented by general formula (I), wherein the specific surface area is about 10 to about 200 m$^2$/g, the specific surface area diameter $D_1$ of primary particles defined by formula (II) is about 10 to about 100 nm, and a $D_2/D_1$ ratio of the average particle size $D_2$ of secondary particles to $D_1$ is about 1 to about 10:

$$M(TiO_3) \qquad (I)$$

wherein M is at least one of Ca, Sr, Ba, Pb, or Mg and $$D_1=6/\rho S \qquad (II)$$

wherein $\rho$ is the density of the particles, and S is the specific surface area of the particles.

2. A process for producing a sol in which a perovskite titanium-containing composite oxide particle represented by general formula (I) is dispersed, comprising the step of allowing a titanium oxide particle comprising a brookite crystalline form to react with a metal salt comprising at least one of Ca, Sr, Ba, Pb, or Mg in a liquid phase:

$$M(TiO_3) \qquad (I)$$

wherein M is at least one of Ca, Sr, Ba, Pb, or Mg.

3. A process for producing a sol in which a perovskite titanium-containing composite oxide particle represented by general formula (I) is dispersed, comprising the step of allowing a titanium oxide sol prepared by subjecting a titanate to hydrolysis in an acid solution to react with a metal salt comprising at least one of Ca, Sr, Ba, Pb, or Mg in a liquid phase:

$$M(TiO_3) \qquad (I)$$

wherein M is at least one of Ca, Sr, Ba, Pb, or Mg.

4. The production process of said sol as claimed in claim 2, wherein said liquid phase is alkaline.

5. The production process of said sol as claimed in claim 3, wherein said liquid phase is alkaline.

6. The sol as claimed in claim 1, wherein the specific surface area of the perovskite titanium-containing composite oxide particle is 28 to about 200 m$^2$/g.

7. The sol as claimed in claim 1, wherein the diameter $D_1$ of primary particles defined by formula (II) is about 10 to 50 nm.

* * * * *